United States Patent [19]

Nakamura et al.

[11] 4,368,524
[45] Jan. 11, 1983

[54] SEMICONDUCTOR DEVICE

[75] Inventors: Kazuhisa Nakamura, San Jose, Calif.; Hideki Arakawa, Yokohama, Japan

[73] Assignee: Fujitsu Limited, Kawasaki, Japan

[21] Appl. No.: 170,175

[22] Filed: Jul. 18, 1980

[30] Foreign Application Priority Data

Jul. 26, 1979 [JP] Japan .................................. 54-95348

[51] Int. Cl.³ .............................................. G11C 7/00
[52] U.S. Cl. ................................... 365/226; 365/185; 365/189; 365/176
[58] Field of Search ............... 365/176, 184, 185, 189, 365/226

[56] References Cited

U.S. PATENT DOCUMENTS

| | | | |
|---|---|---|---|
| 3,836,894 | 9/1974 | Cricchi | 365/176 |
| 3,846,768 | 11/1974 | Krick | 365/184 |
| 3,971,001 | 7/1976 | Lodi | 365/184 |
| 4,142,251 | 2/1979 | Mintz | 365/176 |
| 4,148,099 | 4/1979 | Lauffer et al. | 365/226 |
| 4,156,940 | 5/1979 | Hollingsworth et al. | 365/189 |

*Primary Examiner*—Stuart N. Hecker
*Attorney, Agent, or Firm*—Staas & Halsey

[57] ABSTRACT

A semiconductor device for comprising electrically alterable read-only memories formed in and on the same silicon substrate is disclosed. The read-only memories are driven by both a first voltage having one polarity and a second voltage having the opposite polarity. The first voltage is supplied from an external unipolar voltage source, but the second voltage is generated by a bipolar voltage generator which is located on the same silicon substrate and is driven by said external unipolar voltage source.

8 Claims, 9 Drawing Figures

SEMICONDUCTOR DEVICE

The present invention relates to a semiconductor device, and more particularly relates to a non-volatile EAROM (Electrically-Alterable ROM).

A programmable ROM (read-only memory) is widely utilized in, for example, a computer-aided data processing system. Usually, a ROM can be programmed only once, either at the factory or in the field, by electrically fusing of otherwise removing unwanted internal links. Accordingly, the conventional programmable ROM has a defect in that a mistake in the programming cannot be corrected. For the purpose of overcoming the above mentioned defect, and EPROM (Erasable Programmable ROM) has been proposed and widely utilized in many nations. In the EPROM, the stored data can be erased by ultraviolet light and each bit can be electrically reprogrammed with appropriate voltage pulses. However, in the conventional EPROM, since ultraviolet light is required for reprogramming the stored data, it is not easy for an operator to freely reprogram the stored data.

In recent years, a non-volatile EAROM has been proposed. The EAROM can be programmed and reprogrammed by using only electric signals instead of using ultraviolet light, as does in the conventional EPROM. One of the known EAROMs is basically comprised of a source region, a drain region, a channel area formed between these source and drain regions, and electrically floating gate formed above the channel area and a control gate formed over the floating gate. As is known, when a logic "1" is to be written in the EAROM, a negative write voltage $V_w$, which has a relatively low level, for example $-10$ V, is applied to the control gate. Then holes are introduced from the channel area into the floating gate, due to an avalanche break down effect or a tunnel effect, and a write operation is completed. When the stored logic "1" is to be erased, a positive erase voltage $V_e$, which has a relatively high level, for example $+20$ V, is applied to the control gate. Then electrons are introduced from the channel area into the floating gate, and accordingly the stored holes are canceled by the newly introduced electrons. Thus, an erase operation is completed. A usual read operation is conducted by using a small read voltage, for example $+3$ through $+5$ V, applied to the control gate.

As mentioned above, the known EAROM has a defect in that three different voltage sources, including both positive and negative voltage sources, are required for operating the EAROM.

Therefore, it is an object of the present invention to provide a semiconductor device for comprising the EAROM, which does not require three different voltage sources, but only two different voltage sources. Further, these two different voltage sources are unipolar voltage sources, such as a $+5$ V voltage source and a $+20$ V voltage source, and accordingly, an inverse polar voltage source, such as $-10$ V, is not necessary.

The present invention will be more apparent from the ensuing description with reference to the accompanying drawings wherein.

Figure 3:
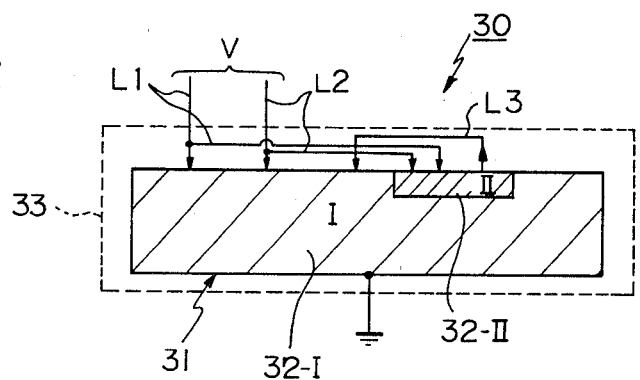
FIG. 3 illustrates a schematic cross-sectional view of an EAROM according to the present invenion.
Figure 5:
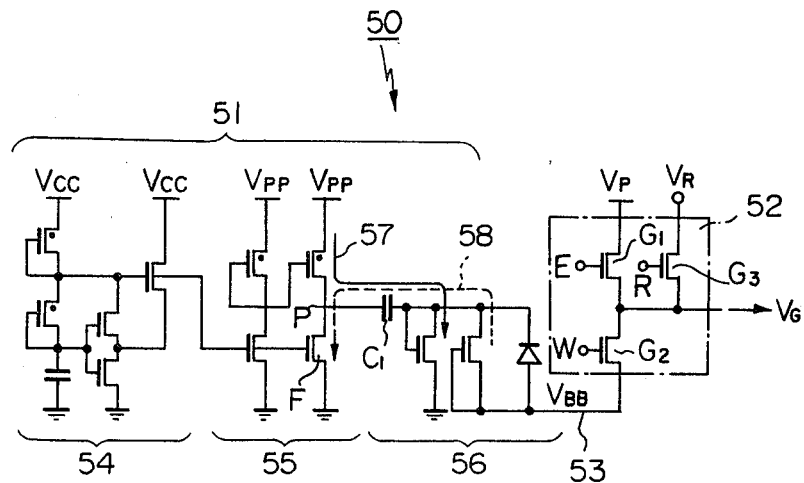
Figure 6:
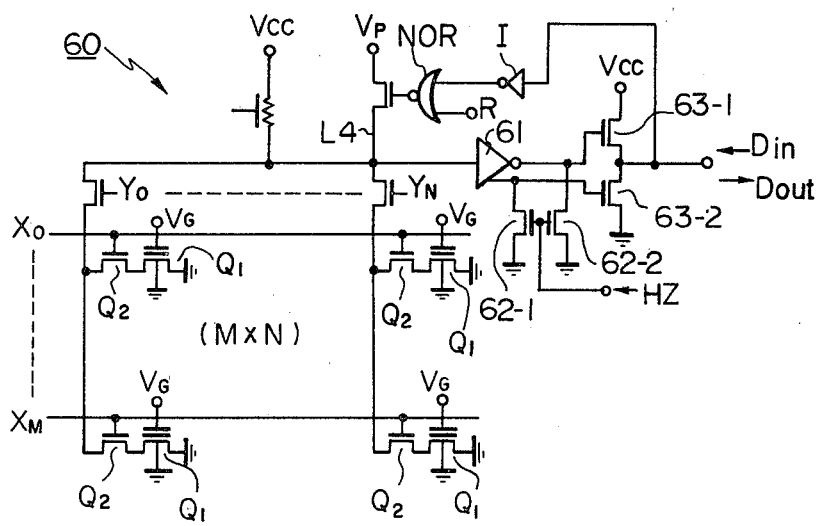

FIGS. 4A, 4B, 4C and 4D respectively illustrate cross-sectional views of a first, a second, a third and a fourth example for fabricating a first block 32-I and a second block 32-II illustrated in FIG. 3;

FIG. 5 illustrates a circuit diagram of one example of a bipolar voltage generator, and;

FIG. 6 illustrates a circuit diagram of a conventional EAROM to be formed in a first block (32-I).

Figure 1:
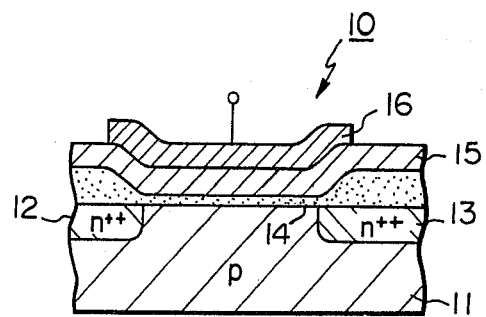
FIG. 1 illustrates a cross-sectional view of a MNOS FET type EAROM.
Figure 2:
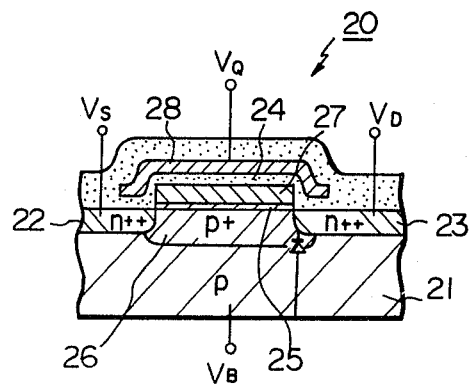
FIG. 2 illustrates a cross-sectional view of a NAMIS FET type EAROM.

A write operation for the EAROM may be achieved by either one of two typical methods. One of the methods is called a tunnel-injection method and the other method is called an avalanche-injection method. The tunnel-injection method can be employed in a so-called MNOS FET (Metal Nitride Oxide Semiconductor Field Effect Transistor) type EAROM. The avalanche-injection method can be employed in a so-called SAMOS (Stacked-gate Avalanche injection Metal Oxide Semiconductor) FET type EAROM. FIG. 1 illustrates a cross-sectional view of a typical MNOS FET type EAROM and FIG. 2 illustrates a cross-sectional view of a typical NAMIS FET (Nitride Avalanche Injection Metal Insulated Semiconductor FET) type EAROM which is one of said SAMOS FET type EAROM. It should be noted that since the NAMIS FET type EAROM is superior to the NMOS FET type EAROM, with respect to a non-volatile characteristic, the present invention will be explained later by taking as an example the latter type EAROM. However, it should be understood that the present invention can be applied to both the MNOS and NAMIS type EAROMs. In FIG. 1, a N-channel MNOS FET type EAROM 10 is comprised of a p-type silicon substrate 11, an $n^{++}$-type source region 12, an $n^{++}$-type drain region 13, a silicon dioxide ($SiO_2$) layer 14, a silicon nitride layer 15 and a metal gate 16. In the MNOS FET type EAROM 10, a write operation or an erase operation is conducted by applying bipolar electric fields, selectively, across the substrate 11 and the metal gate 16, said bipolar fields having strengths stronger than that of the bipolar critical electric fields. In this case, a tunnel current flows through the layer 14 so as to conduct the write operation or the erase operation.

In FIG. 2, an n-channel NAMIS FET type EAROM 20 is comprised of a p-type silicon substrate 21, an $n^{++}$-type source region 22, an $n^{++}$-type drain region 23, a silicon dioxide ($SiO_2$) layer 24, a thermal nitride layer 25, a $p^+$-type region 26, a floating gate 27 and a control gate 28. The operation of the EAROM 20 will be clarified with reference to the following Table.

TABLE

| OPERATION | VOLTAGES | | | |
|---|---|---|---|---|
| | $V_D$ | $V_S$ | $V_G$ | $V_B$ |
| WRITE (hole injection) | +15 ⎍ 0⎦ | 0 or OPEN | ⎍⎍ −10 | 0 |
| ERASE (electron injection) | +15 ⎍ 0⎦ | 0 or OPEN | +20 ⎯⎬⎯ | 0 |
| READ | $V_D(<V_{DB})$ | 0 | $V_r$ | 0 |

According to the above Table, when the write operation is conducted, a relatively high drain voltage $V_D$ (see FIG. 2), such as $+15$ V, is applied to the drain region 23 (see FIG. 2). At the same time, a soure voltage $V_S$ (see FIG. 2) of 0V is applied to the source region 22 (see FIG. 2) (or the source terminal is opened) and a substrate voltage $V_B$ (see FIG. 2) of 0V is applied to the substrate 21 (see FIG. 2). Thus, the avalanche takes place in a part adjacent to the draing region 23, of the p+-type region 26 (see FIG. 2) and holes are injected into the floating gate 27 by a negative control gate voltage $V_G$. In this case, the lower the level of the control gate voltage $V_G$ (see FIG. 2), the more holes may be introduced into the floating gate 27.

When the erase operation is conducted, a relatively high drain voltage $V_D$, such as +15 V, is applied to the drain region 23. At the same time, a source voltage $V_S$ of 0V is applied to the source region 22 (or the source terminal is opened) and a substrate voltage $V_B$ of 0V is applied to the substrate 21. Thus, the avalanche takes place in a part, adjacent to the drain region 23, of the p+-type region 26 and electrons are injected into the floating gate 27 by a positive control gate voltage $V_G$. In this case, the higher the level of the control gate voltage $V_G$, the more electrons may be introduced into the floating gate 27.

During the usual read operation, a drain voltage $V_D$, such as +2 V, which is far lower than a breakdown voltage $V_{DB}$, is applied to the drain region 23. At the same time, a source voltage $V_S$ of 0V, a control gate voltage $V_G$ of $V_r$, such as +3 V, and a substrate voltage $V_B$ of 0V are applied to the respective regions.

As is apparent from the column ($V_G$) of the above Table, the negative voltage of $V_G$ during the write operation, and the positive voltage of $V_G$, during the erase operation must be selectively applied to the control gate 28. That is bipolar voltage sources must be employed for driving the EAROM 20. Specifically, in this example, +20 V, +5 V and −10 V voltage sources are required.

However, according to the present invention, the EAROM can be driven merely by two voltage sources having the same polarity of output voltage, such as +5 V and +20 V, and accordingly, a negative voltage source is not required. FIG. 3 illustrates a schematic cross-sectional view of an EAROM according to the present invention. In FIG. 3, the EAROM 30 is comprised of a silicon substrate 31. The substrate 31 is divided into a first block 32-I and a second bock 32-II. These blocks 32-I and 32-II are electrically insulated from each other. The first block 32-I contains therein many electrically alterable read-only memory cells (not shown). The first block 32-I receives first voltages applied from an external unipolar voltage source V. Said first voltages are, for example +5 V and +20 V. As previously mentioned, the electrically alterable memory cells must be driven by said first voltages and also by a second voltage, such as −10 V, via respective sources, drains and control gates. However, since the external unipolar voltage source V produces only first voltages, the second voltage cannot be produced therefrom. In order to produce the second voltage to be applied to the first block 32-I, a bipolar voltage generator (not shown) is created in the second block 32-II. A line L1 is, for example, a +20 V supplying line. A line L2 is, for example, a +5 V supplying line. A line L3 is, for example a −10 V supplying line to be connected to control gates. The line L3 is also, for example, a +20 V or +5 V supplying line to be connected to control gates. In FIG. 3, a dotted line 33 represents a package for making one unit of EAROM. Thus, although the package 33 is driven by internal bipolar voltages, however, the package 33 is driven only by an external unipolar voltage source.

Figure 4A:
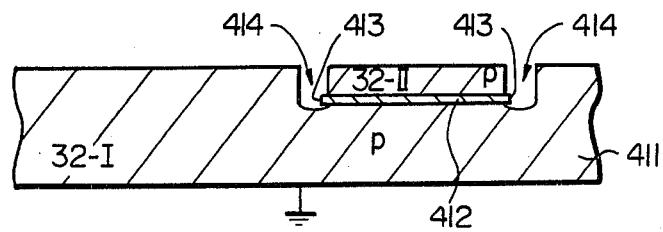

FIGS. 4A, 4B, 4C and 4D respectively illustrate a first, a second, a third and a fourth example for fabricating the first block 32-I and the second block 32-II shown in FIG. 3. In FIG. 4A, the reference numeral 411 represents, for example, a p-type silicon substrate which acts as the first block 32-I. A buried insulation layer 412 is created by a O2-ion or N2-ion injection. Thus, the insulation layer 412 is made of silicon dioxide (SiO2) or silicon nitride (Si3N4). Then, a groove 414 is created by an etching process, in the substrate 411, so that the peripheral area 413 of the layer 412 extrudes into the groove 414. Thus, the second block 32-II is electrically insulated from the first block 32-I.

Figure 4B:
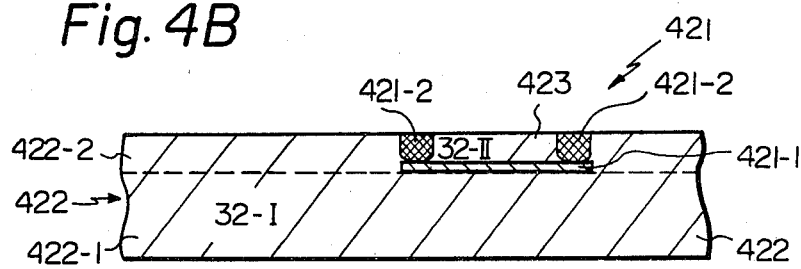

In FIG. 4B, a layer 422, acting as the first block (32-I), is made of a substrate 422-1 and an epitaxial layer 422-2. A vessel 421 is made of a buried insulation layer 421-1 and a ring-shaped selective oxide area 421-2. A portion 423, acting as the second block (32-II), is entirely and electrically insulated from the block (32-I) by the vessel 421.

Figure 4C:
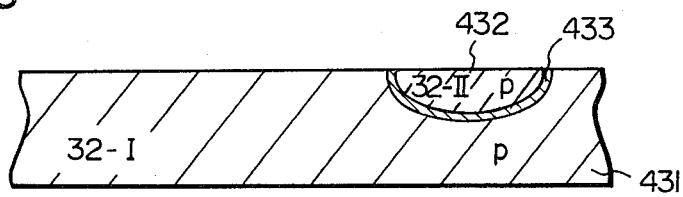

In FIG. 4C, the reference numeral 431 represents a silicon substrate having one conductivity, such as a p-type silicon substrate. A well 433 having an opposite conductivity, such as a n-type well, is formed in the substrate 431. Then a p-type well 432 is formed in the well 433. When the p-type substrate 431 and the n-type well 433 are inversely biased, the well 432 is electrically isolated from the substrate 431. Thus, the substrate 431 can act as the first block (32-I), while, the well 432 can act as the second block (32-II).

Figure 4D:
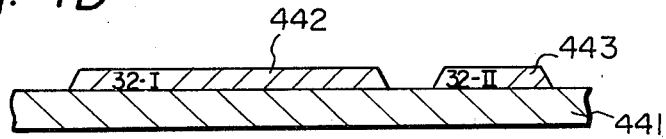

In FIG. 4D, the reference numeral 441 represents a sapphire substrate. One silicon substrate chip 442 is located on the substrate 441 and another silicon substrate chip 443 is located thereon. The chips 442 and 443 are physically, and accordingly electrically, isolated from each other. Thus, the chip 442 can act as the first block (32-I) and the chip 443 can act as the second block (32-II).

Each of the above-mentioned second blocks (32-II) contains therein a bipolar voltage generator, which is driven by an external unipolar voltage source V (see FIG. 3), and produces bipolar voltages, such as +20 V, +3 V and −10 V, selectively. FIG. 5 illustrates a circuit diagram of one example of a bipolar voltage generator. A bipolar voltage generator 50 is comprised of a so-called unidirectional charge pump 51 and a gate means 52. The charge pump 51 collects either holes or electrons at a certain portion, for example a portion 53. In this example, electrons are collected at the portion 53 and supplied, in a form of a voltage $V_{BB}$, such as −10 V, via the line L3 (FIG. 3), to the gate means 52. The gate means 52 also receives a voltage $V_P$, such as +20 V, via the line L1 (FIG. 3), and a voltage V, such as +5 V or +20 V, via the line L2 or L1 (FIG. 3) and a suitable voltage reducer (not shown), and then produces one of the voltages $V_P$, $V_R$ and $V_{BB}$, selectively, as a control gate voltage $V_G$ to be supplied, via the line L3 (FIG. 3), to the control gate 28 (FIG. 2).

Such unidirectional charge pumps have already been known in the U.S. Pat. No. 3,806,741, however, in FIG. 5, the unidirectional charge pumps 51 is comprised of an oscillating section 54, a buffer section 55 and an inverse voltage generating section 56. Since the section 56 is a heavy load for the section 54, the section 55 is inserted between the sections 54 and 56. The sections 54 and 55 are driven by voltages $V_{cc}$ and $V_{pp}$ such as +5 V and +20 V, to be supplied via the lines L1 and L2 (FIG. 3). When a voltage, at an output terminal P of the buffer section 55, becomes a level "H" (high), a current flows via a capacitor $C_1$ in a direction as indicated by an arrow 57. Then the capacitor $C_1$ is charged by a positive charge (+), at its left terminal, as illustrated in FIG. 5, and simultaneously by a negative charge (−), at its right terminal, as illustrated in FIG. 5. Contrary to the above, when a voltage at the terminal P becomes a level "L" (low), a current flows via the capacitor $C_1$ in a direction as indicated by an arrow 58. In this case, the charges stored in the capacitor $C_1$ are discharged. The voltage at the output terminal P changes from "H" to "L" and vice versa, in synchronism with the oscillating frequency induced by the section 54. When the voltage at the output terminal P is kept at the level "L", the left terminal (+), as illustrated in FIG. 5, of the capacitor $C_1$ is grounded via an enhancement type FET F. Accordingly, the polarity of the voltage $V_{BB}$ is inversed with respect to that of the external voltage $V_{pp}$. In this case, since the voltage $V_{pp}$ is a positive voltage, the voltage $V_{BB}$ becomes a negative voltage.

The gate means 52 is comprised of a first gate G1, a second gate G2 and a third gate G3. When the erase operation of the above-recited Table is conducted, an erase signal E is applied to the first gate G1. Then, the voltage $V_p$, such as +20 V. is produced, as the control gate voltage $V_G$ from the output of the gate means 52. When the write operation of the Table is conducted, a write signal W is applied to the second gate G2. Then, the voltage $V_{BB}$, such as −10 V, is produced as the voltage $V_G$ from the gate means 52. When the read operation of the Table is conducted, a read signal R is applied to the third gate G3. Then the voltage $V_r$, such as +3 V, is produced as the voltage $V_G$ from the gate means 52.

The control gate voltage $V_G$, produced from the gate means 52, is supplied to the EAROM formed in the aforesaid first block (32-I). FIG. 6 illustrates a circuit diagram of a conventional EAROM. In FIG. 6, the symbols $V_{cc}$, $V_p$, $V_G$ and R have the same meanings as those of FIG. 5. An EAROM 60 includes therein (M×N) number of NAMIS FETs $Q_1$ (in FIG. 6, N×N is 4), each of which is identical to the FET 20 shown in FIG. 2. The FETs $Q_1$, cooperate with respective selection gate FETs $Q_2$. One of the desired FET $Q_1$ can be specified by selecting the corresponding selection gate FET $Q_2$ in accordance with both X address bits ($X_0 \ldots X_M$) and Y address bits ($Y_0 \ldots Y_N$). When the write operation is conducted, the control gate voltage $V_G$, such as −10 V, is supplied from the gate means 52 (FIG. 5), and simultaneously, input data $D_{in}$ to be written is applied to a line L4, via an invertor (I) and a NOR gate (NOR). In this case, the read signal R is a logic "0". Also, a high inpedance signal HZ is applied to two FETs 62-1 and 62-2, and accordingly two FETs 63-1 and 63-2 respectively, of an output stage are made to float. When the erase operation is conducted, the control gate voltage $V_G$ such as +20 V, is supplied from the gate means 52 (FIG. 5). In this case, the read signal R is a logic "0", and, also, a high impedance signal HZ is applied to both the FETs 62-1 and 62-2. When the read operation is conducted, the control gate voltage $V_G$ such as +3 V, is supplied from the gate means 52 (FIG. 5). In this case, the read signal R is a logic "1" and the high impredance signal HZ is not applied to the FETs 62-1 and 62-2. Accordingly, the read data from a sense amplifier 61 activates the output stage of the FETs 63-1 and 63-2, so as to produce a data Dout to be read.

As mentioned above, according to the present invention, an EAROM which is driven by only an external unipolar voltage source can be obtained.

We claim:

1. A semiconductor device comprising electrically alterable read-only memory cells formed in and on a silicon substrate, each of said read-only memory cells includes a control gate to which a first voltage having one polarity and a second voltage having an opposite polarity are selectively applied, the silicon substrate has a first block and a second block, each of which blocks is electrically insulated from the other block, wherein the first block contains therein said read-only memories being driven by said first voltage and said second voltage, which first voltage is supplied from an external voltage source, said second block contains therein a bipolar voltage generator being driven by said first voltage of said external voltage source but producing at least said second voltage to be applied to specified one or more said control gates.

2. A semiconductor device as set forth in claim 1, wherein said bipolar voltage generator is comprised of a unidirectional charge pump and a gate means, said gate means selectively produces said second voltage supplied from said unidirectional charge pump and said first voltage, to be applied to said control gate.

3. A semiconductor device as set forth in claim 2, wherein said gate means is comprised of a first gate and a second gate, said first gate is caused to open by an erase signal and provides said first voltage; and said second gate is caused to open by a write signal and provides said second voltage.

4. A semiconductor device as set forth in claim 3, wherein said gate means is further comprised of a third gate which is caused to open by a read signal and provides a third voltage being applied to said control gate, said third voltage has the same polarity as that of said first voltage but a relatively lower voltage level than that of the first voltage.

5. A semiconductor device as set forth in claim 1, wherein said second block is electrically insulated from said first block by forming a buried insulation layer therebetween, a peripheral area of said buried insulation layer extruding in a groove formed between said second and first blocks.

6. A semiconductor device as set forth in claim 1, wherein said second block is entirely insulated by an electrically insulated vessel formed in said first block.

7. A semiconductor device as set forth in claim 1, wherein said first block, having one conductivity, is formed in said silicon substrate, said second block, having one conductivity, is formed in a well, having an opposite conductivity and buried in the silicon substrate, and said well and said silicon substrate are inversely biased.

8. A semiconductor device as set forth in claim 1, wherein said first block is formed in and on one silicon substrate chip and said second block is formed in and on another silicon substrate chip, said chips being electrically and physically isolated from each other but both being located on said sapphire substrate.

* * * * *